United States Patent [19]

Kawai et al.

[11] Patent Number: 4,877,974
[45] Date of Patent: Oct. 31, 1989

[54] CLOCK GENERATOR WHICH GENERATES A NON-OVERLAP CLOCK HAVING FIXED PULSE WIDTH AND CHANGEABLE FREQUENCY

[75] Inventors: Hiroyuki Kawai; Shinichi Nakagawa, both of Itami, Japan

[73] Assignee: Mitsubishi Denki Kabushiki Kaisha, Japan

[21] Appl. No.: 189,885

[22] Filed: May 3, 1988

[30] Foreign Application Priority Data

Dec. 4, 1987 [JP] Japan .................................. 62-308195

[51] Int. Cl.$^4$ ........................ H03K 5/13; H03K 7/00; H03K 17/80; H03K 5/00
[52] U.S. Cl. .................................... 307/269; 307/511; 307/480; 307/409; 307/262; 307/601; 307/602; 307/606; 328/55; 328/63; 328/72; 328/155
[58] Field of Search ............... 307/269, 511, 480, 409, 307/262, 601, 606, 602; 328/55, 63, 72, 133, 179, 155, 201, 62

[56] References Cited

U.S. PATENT DOCUMENTS

| | | | |
|---|---|---|---|
| 3,448,295 | 6/1969 | Wanlass | 328/62 |
| 3,961,269 | 6/1976 | Alvarez, Jr. | 328/62 |
| 4,386,323 | 5/1983 | Jansen | 328/63 |
| 4,463,440 | 7/1984 | Nishiura et al. | 307/269 |
| 4,554,465 | 11/1985 | Koike | 307/269 |
| 4,654,599 | 3/1987 | Zbinden et al. | 328/55 |
| 4,675,612 | 6/1987 | Adams et al. | 328/63 |
| 4,713,621 | 12/1987 | Nakamura et al. | 307/269 |
| 4,719,365 | 1/1988 | Misono | 307/269 |
| 4,758,737 | 7/1988 | Hirano | 307/269 |

OTHER PUBLICATIONS

"Handbook of Microcircuit Design and Application" David F. Stout, McGraw Hill, Chap. 9, pp. 9-3, 98-4.

Primary Examiner—Stanley D. Miller
Assistant Examiner—Trong Quang Phan
Attorney, Agent, or Firm—Townsend & Townsend

[57] ABSTRACT

A clock generator which is cascade connected a plurality of single-phase pulse generator circuits including RS flip-flops and delay circuits for defining the pulse width of one output at the RS flip-flop through gates controlling propagation of the other output of the RS flip-flop, so that the final clock frequency is variable by switching control of each gate, whereby a pulse width of each single-phase clock is defined by a delay duration of a delay circuit, thereby not depending on wave forms of the external clock and also the gates connected between the respective single-phase pulse generating circuits are switching-controlled to enable the frequency of the output clock to be variable.

5 Claims, 5 Drawing Sheets

CLOCK GENERATOR WHICH GENERATES A NON-OVERLAP CLOCK HAVING FIXED PULSE WIDTH AND CHANGEABLE FREQUENCY

BACKGROUND OF THE INVENTION

1. Field of the Invention

This invention relates to a clock generator, and more particularly to a clock generator which generates a clock signal of further high frequency required for a digital signal processor or the like operating at high speed.

2. Description of the Prior Art

FIG. 1 is a circuit diagram of the conventional 4-phase non-overlap clock generator and FIG. 2 is a timing chart thereof. The clock generating circuit, whose structure is shown in FIG. 1, is similar in fundamental structure and operation to a circuit disclosed in the "Handbook of Microcircuit Design and Application" chapter 9, pages 9-3 to 9-4, written by David F. Atout and published by McGRAW-HILL Book Company.

In FIG. 1, a reference numeral 1 designates a ½ frequency divider. The ½ frequency divider 1 generates signals A and B of external clock ECLK inputted from the exterior divided into ½, that is, of frequency two times larger than the external clock ECLK.

The ½ frequency divider 1 comprises AND gates 2 and 3, NOR gates 4 and 5, OR gates 6 and 7 and NAND gates 8 and 9.

Concretely, the external clock ECLK is introduced into the AND gates 2 and 3 and OR gate 6, the output of AND gate 2 being introduced in the NOR gate 4, and the output of AND gate 3 being introduced in the NOR gate 5. The output D of NOR gate 4 is introduced in the NOR gate 5 and OR gate 6, the output of NOR gate 5 being introduced into the NOR gate 4 and OR gate 7.

Meanwhile, the output of OR gate 6 is given into the NAND gate 8, the output B of the NAND gate 8 being introduced into the AND gate 3 and NAND gate 9 and also to the exterior of ½ frequency divider 1. Furthermore, the output of OR gate 7 is introduced into the NAND gate 9, the output thereof being introduced in the AND gate 2 and NAND gate 8 and also to the exterior of the ½ frequency divider 1.

Reference numeral 10 designates an AND gate outputting a first clock $\phi_1$, by taking a logical product of the output A of the NAND gate 9 and external clock ECLK.

Reference numeral 11 designates an AND gate outputting a second clock $\phi_2$ by taking a logical product of the output B of NAND gate 8 and external clock ECLK.

Reference numeral 12 designates an AND gate outputting a third clock $\phi_3$ by taking a logical product of the output B of the NAND gate 8 and external clock ECLK.

Reference numeral 13 designates an AND gate outputting a fourth clock $\phi_4$ by taking a logical product of the output A of NAND gate 9 and external clock EDLK.

The first clock $\phi_1$, the output of AND gate 10 is introduced into the AND gate 11 through an inverter 14, the second clock $\phi_2$, the output of AND gate 11 into the AND gate 12 through an inverter 15, the third clock $\phi_3$, the output of AND gate 12 into the AND gate 13 through an inverter 16, and the fourth clock $\phi_4$, the output of AND gate 13 into the AND gate 10 through an inverter 17.

Such conventional pulse generating circuit operates as shown in the timing chart in FIG. 2 and as follows:

When the ½ frequency divider 1 is given the external clock ECLK, the signal A is turned to a low level in synchronism with the trailing edge of external clock ECLK and to a high level in synchronism with the next trailing edge of the external clock ECLK.

The signal B is turned to a low level in synchronism with the trailing edge of external clock ECLK and to a high level in synchronism with the next trailing edge of external clock ECLK.

The signal C is turned from the high level to the low level in synchronism with the leading edge of external clock ECLK and from the low level to the high level in synchronism with the next leading edge of external clock ECLK.

The signal D is turned from the high level to the low level in synchronism with the leading edge of external clock ECLK and from the low level to the high level in synchronism with the next leading edge of external clock ECLK.

The first clock $\phi_1$, is the output of the AND gate 10 into which the external clock ECLK, signal A and an inverted signal fo the fourth clock $\phi_4$ being the output of inverter 17 are introduced. Accordingly, since the first clock $\phi_1$, is inhibited from being at a high level for the period of time when the fourth clock $\phi_4$ is at a high level, the first clock $\phi_1$, is prevented from overlapping with the fourth clock $\phi_4$.

The second clock $\phi_2$ is the output of AND gate 11 into which an inverted signal of external clock ECLK, the signal B and an inverted signal of the first clock $\phi_1$ being the output of the inverter 14 are introduced. Accordingly, since the second clock $\phi_2$ is inhibited from being at a high level for the period of time when the first clock $\phi_1$ is at a high level, the second clock $\phi_2$ is prevented from overlapping with the first clock $\phi_1$.

The third clock $\phi_3$ is the output of AND gate 12 into which the external clock ECLK, signal B and an inverted signal of the second clock $\phi_2$ being the output of the inverter 15 are introduced. Accordingly, since the third clock $\phi_3$ is inhibited from being a high level for the period of time when the second clock $\phi_2$ is at a high level, the third clock $\phi_3$ is prevented from overlapping with the second clock $\phi_2$.

Furthermore, the fourth clock $\phi_4$ is the output of AND gate 13 into which an inverted signal of external clock ECLK, the signal A and an inverted signal of the third clock $\phi_3$ being the output of the inverter 16 are introduced. Accordingly, since the fourth clock $\phi_4$ is inhibited from being at a high level for the period of time when the third clock $\phi_3$ is at a high level, the fourth clock $\phi_4$ is prevented from overlapping with the third clock $\phi_3$.

Thus, the first clock $\phi_1$, through the fourth clock $\phi_4$ are non-overlap 4-phase clocks.

The above conventional clock generator has various problems as follows:

A circuit scale is relatively larger and the frequency of generated clock cannot desirably be changed.

The clock used withint he processor is required of further high frequency, as the digital signal processor has recently been improved in performance, but it is difficult from restriction of a crystal oscillator or the like for being given the external clock that the external clock of a duty ratio of 50% or more is obtained in a further higher frequency zone.

In the above-mentioned conventional clock generator, however, the external clock ECLK is given at the four AND gates 10 through 13, whereby waveforms of the first clock $\phi_1$ to fourth clocks $\phi_4$ depend on the waveform of external clock ECLK. Therefore, it is difficult to obtain the clock to meet conditions of spec needful to the processor such as, for example, the frequency and non-overlap clock.

SUMMARY OF THE INVENTION

In the light of the above-mentioned circumstance, the present invention has been designed.

A first object thereof is to provide a clock generating circuit which does not depend on a duty ratio of external clock, but can generate a non-overlap clock of a fixed pulse width.

A second object of the invention is to provide a clock generator changeable of the frequency of the non overlap clock by a desired set value from the exterior.

A third object of the invention is to provide a clock generator which incorporates therein the clock generating circuit so as to generate the non overlap clock of a fixed pulse width without depending on the duty ratio of the external clock and which is changeable of the frequency of the non overlap clock.

The clock generator of the present invention is so constructed that single-phase pulse generating circuits each having an RS flip-flop and a delay circuit for controlling pulse width of one output of the RS flip-flop are cascade-connected through gates restricting the other output of the RS flip-flop from propagating to the next stage pulse generating circuit, thereby enabling the finally outputted frequency of clock to be changed by switching control of each gate.

The clock generator of the invention of such construction decides the pulse width of each single-phase clock by a delay time of a delay circuit not to depend on the waveforms of external clock and can desirably change the frequency of the output clock by switching control of the gate connecting between the respective single-phase pulse generating circuit.

The above and further objects and features of the invention will more fully be apparent from the following detailed description with accompanying drawings.

DESCRIPTION OF THE PREFERRED EMBODIMENT

Next, an embodiment of a clock generator of the invention will be described in accordance with the accompanying drawings.

Figure 1:
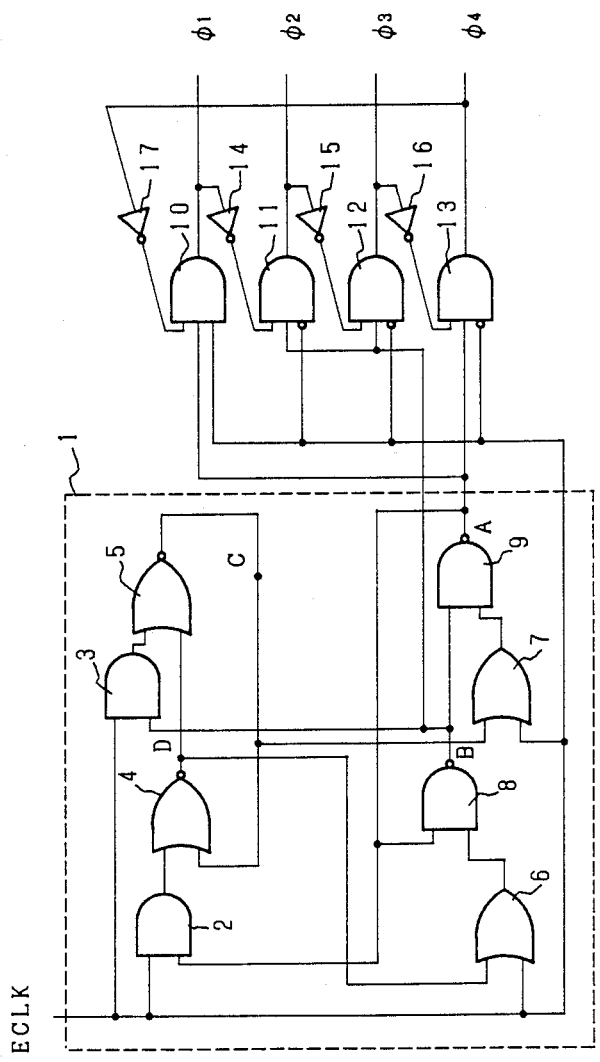
FIG. 1 is a logical circuit diagram of the conventional clock generator.
Figure 2:
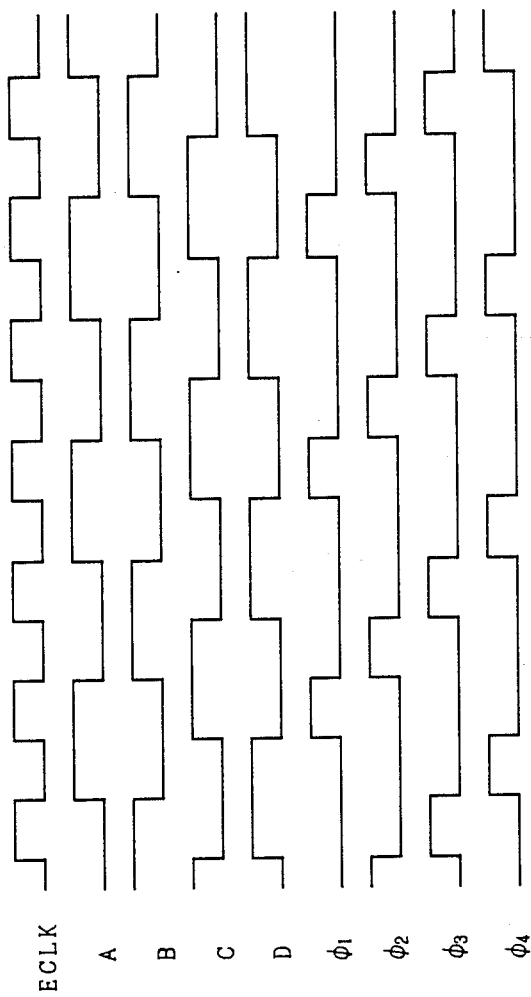
FIG. 2 is a timing chart explanatory of operation thereof.
Figure 3:
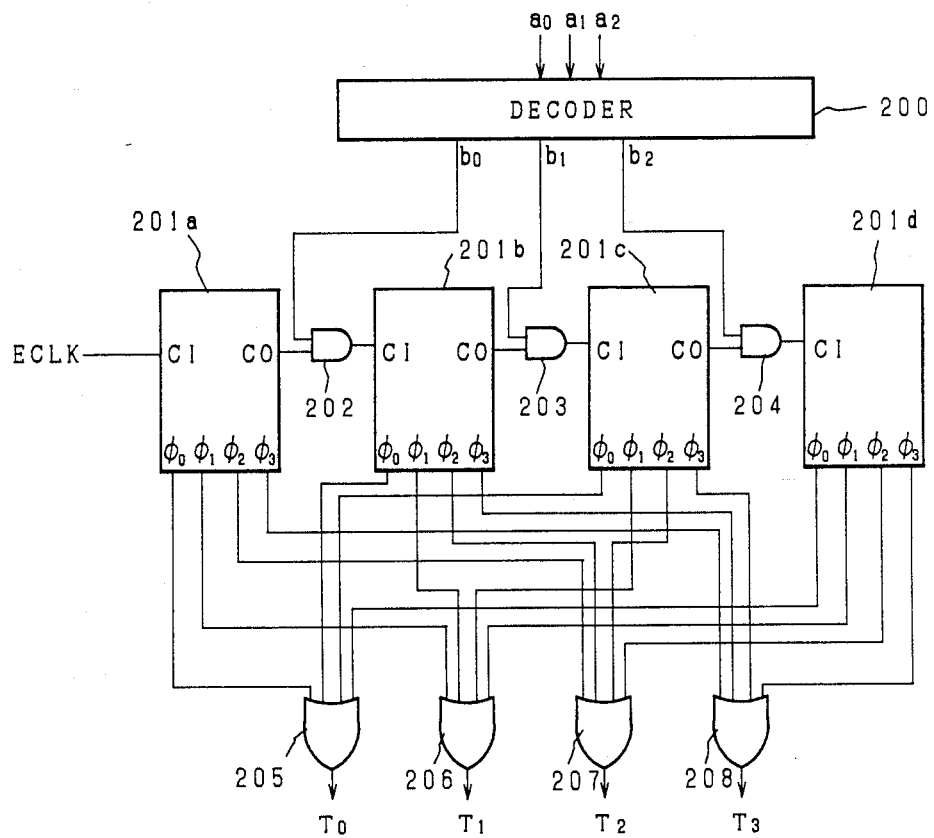
FIG. 3 is a block diagram of an embodiment of a clock generator of the present invention.
Figure 4:
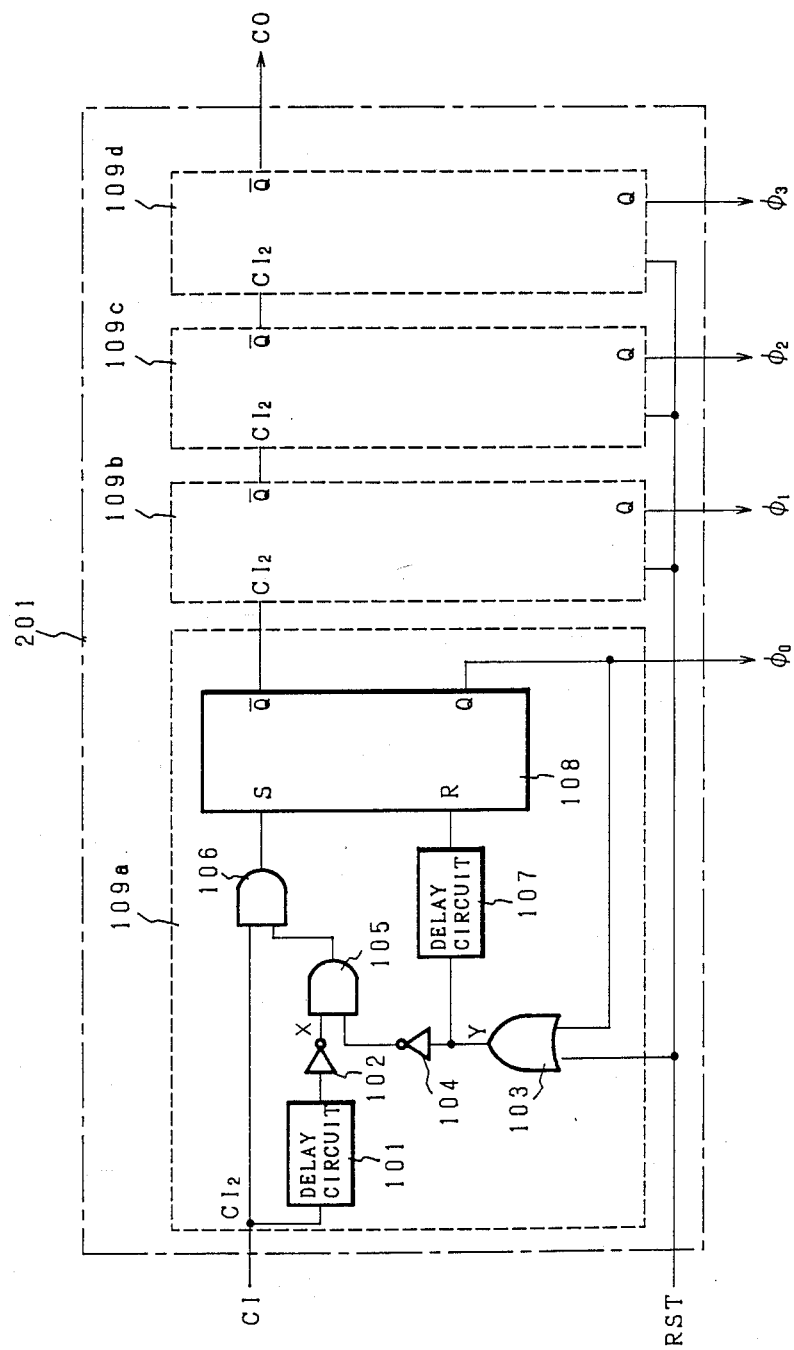
FIG. 4 is a logical circuit diagram of each clock generating circuit of the clock generator shown in FIG. 3.

Referring to FIGS. 3 and 4, the clock generator of the invention is shown in the block diagram and the logical circuit diagram of concrete constitution thereof.

In the drawings, a reference numeral 200 designates a decoder, which decodes 3-bit inputs $a_0$, $a_1$ and $a_2$ indicating the frequency of output clock to thereby output them as the outputs $b_0$, $b_1$ and $b_2$ respectively.

Reference numerals 201a through 201d are 4- phase non overlap clock generating circuits. The circuits 201a and 201b, 201b and 201c, and 201c and 201d are connected therebetween by 2-input AND gate 202, 203 and 204 respectively and cascade-connected as a whole.

One input of each AND gate 202, 203 and 204 connected to the output terminal CO of the previous stage clock generating circuit and another input of the respective AND gate is connected to the outputs $b_0$, $b_1$ and $b_2$ of the decoder 200 respectively, and output of the respective AND gate is connected to the input terminal CI of the next-state clock generating circuit.

The respective clock generating circuits 201a to 201d generate 4-phase clocks $\phi_0$ to $\phi_3$ as discussed below. From the respective clock generating circuits 201a through 201d, a first clock $\phi_0$ is introduced into a first OR gate 205 of four inputs, a second clock $\phi_1$ into a second OR gate 206 of the same, a third clock $\phi_2$ into a third OR gate 207 of four inputs, and a fourth clock $\phi_3$ into a fourth OR gate 208 of four inputs.

In addition, the OR gate 205 through 208 output signals $T_0$, $T_1$, $T_2$ and $T_3$ respectively.

Next, explanation will be given on construction of the respective clock generating circuits 201a to 201d with reference to FIG. 4.

In FIG. 4, reference numerals 109a to 109d designate single-phase pulse generating circuits, the clock generator circuits 201a to 201d comprising the pulse generator circuits 109a to 109d cascade-connected.

The respective pulse generating circuits 109a to 109d are given a reset signal RST and given at an input $CI_2$ the external clock ECLK or the output from the respective clock generating circuits 201a to 201c at the previous stage through the AND gates 202 through 204. The input $CI_2$ is given to an AND gate 106 and delayed by a delay circuit 101, and further a signal X inverted by an inverter 102 is given to an AND gate 105.

On the other hand, the reset signal RST is given to an OR gate 103, an output Y thereof is delayed by a delay circuit 107 and given to the reset terminal R of an RS flip-flop 108 and inverted by an inverter 104 so as to be given to the AND gate 105. The output of the AND gate 105 is given to the aforesaid AND gate 106, the output thereof being given to the set terminal S at the RS flip-flop 108.

The inverted output terminal $\overline{Q}$ at each RS flip-flop 108 becomes an output CO to the respective pulse generator circuits at the next stage or the respective clock generator circuits 201b to 201d at the next stage, the output terminal Q being output clocks $\phi_0$ through $\phi_3$.

Figure 5:
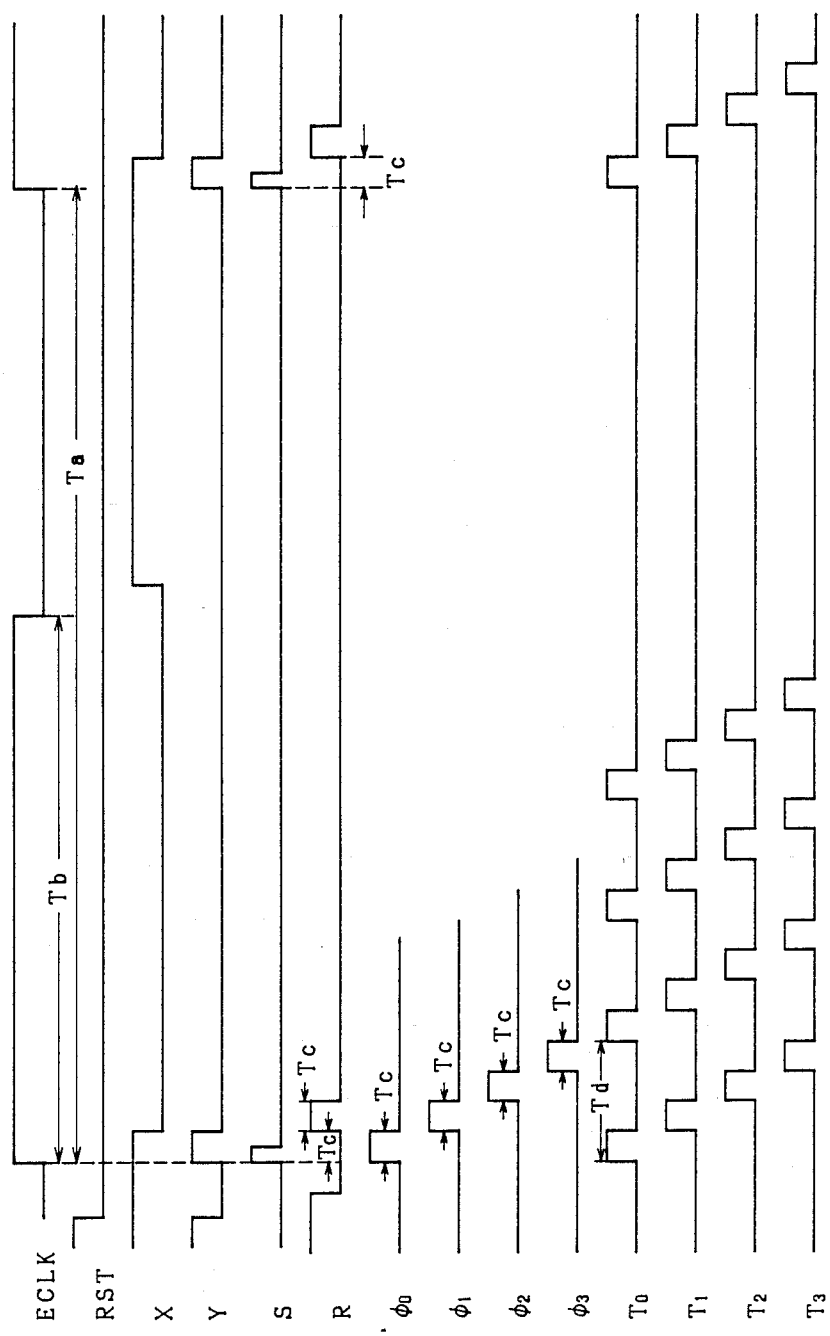
FIG. 5 is a timing chart explanatory of operation of the clock generating circuit of the present invention.

Next, explanation will be given on an operation of the clock generator of the present invention with reference to the FIG. 5 timing chart.

The clock generating circuits 201a through 201d operate respectively as follows:

When the reset signal RST is kept at a high level, the output Y of the OR gate 103 is kept at high level.

A delay time of the delay circuit 107 is set Tc and the output of the circuit 107, that is, the input to the reset terminal R at the RS flip-flop 108, is delayed only by a time Tc and then turned to a high level after the output Y of the OR gate 103 is turned to a high level.

As a result, the output terminal Q at the RS flip-flop 108 is turned to a low level and the inverted output terminal Q to a high level.

In a case where the OR gate 103 is at a high level, the output of the inverter 104 is at a low level, whereby the AND gates 105 and 106 each are at a low level and the input at the set terminal S of the RS flip-flop 108 is at a low level. Hence, such reset operation allows the output terminal Q at each RS flip-flop 108 to be at a low level.

Thereafter, when the reset signal RST is turned to a low level, the inputs to the set terminal S and reset terminal R at the RS flip-flop 108 both are at the low level, whereby the outputs of both the output terminal Q and $\bar{Q}$ at the RS flip-flop 108 keep the previous condition.

After such initial operation, when the external clock ECLK of a cycle duration Ta and a high level duration Tb is introduced into the input terminal CI at the first stage clock generating circuit 201a, the circuit of the invention starts its operation.

Next, explanation will be given on an operation when the inputs $a_0$, $a_1$ and $a_2$ to the decoder 200 indicating the frequency of output clock are logical "100", in other words, when indicated to output clock whose frequency is four times of the the external clock ECLK. In this case, logical "1" is given to the another input of all the AND gates 202, 203 and 204 between the respective clock generating circuits.

At the respective clock generating circuits 201a to 201d, when the external clock ECLK rises to a high level, the signal S taking a logical product of the external clock ECLK and signal X delayed by the delay circuit 101 and inverted by the inverter 102, is given to the set terminal S at the RS flip-flop 108.

Since the leading edge to a high level of the input to the set terminal S of the RS flip-flop 108 sets the RS flip-flop 108, the output of output terminal Q, that is, the clock $\phi_0$ turns to a high level.

Simultaneously, the output of the output terminal Q is propagated to the OR gate 103, inverter 104 and AND gates 105 and 106 to thereby turn the input to the set terminal S at the RS flip-flop 108 to a low level.

Also, the output Y of the OR gate 103 is delayed only by a time Tc by the delay circuit 107 to allow the reset terminal R at the RS flip-flop 108 to turn to a high level. Hence, the output $\phi_0$ of the output terminal Q at the RS flip-flop 108 is turned to a low level, the output of the inverted output terminal $\bar{Q}$ to a high level.

Since the output from the inverted output terminal $\bar{Q}$ at the RS flip-flop 108 is given to the input terminal $CI_2$ at the next stage pulse generating circuit 109b, the pulse generating circuit 109b also repeats the similar operation to the aforesaid pulse generating circuit 109a, thereby generating the clock $\phi_1$.

In the same way, the pulse generating circuits 109c and 109d generate clocks $\phi_2$ and $\phi_3$ respectively.

Thus, the clock generating circuit 201a (201b, 201c or 201d) generates 4-phase non overlap clock $\phi_0$, $\phi_1$, $\phi_2$ or $\phi_3$.

A length of high level duration of clock thus generated is equal to the delay time Tc of the delay circuit 107, thereby not at all depending on length Tb of the high level duration of external clock ECLK.

The output of the inverted output terminal Q of clock generating circuit 201a at the last stage pulse generating circuit 109d is given from the output terminal CO thereof to one input of the AND gate 202. At this time, as described above, logical "1" is given to the another input of the AND gate 202, so that the output of the output terminal CO is propagated to the input terminal $CI_2$ at the next stage clock generating circuit 201b through the gate circuit 202. The duration from outputting clock $\phi_0$ by one of the clock generating circuits 201a through 201c until the next stage clock generating circuit 201b, 201c or 201d outputs clock $\phi_0$ is Td (four times larger than Tc at the present embodiment).

Next, since the signal, in the same way as the above, is propagated through each AND gates 203 or 204, each clock generating circuit 201c of 201d operates in the same way.

The OR gate 205 takes a logical add of clocks $\phi_0$ of the clock generating circuit 201a to 201d thereby obtain the clocks $T_0$; the same of $\phi_1$ to obtain the clock $T_1$; the same of $\phi_2$ to obtain the clock $T_2$; and the same of $\phi_3$ to obtain the clock $T_3$.

The signal introduced in the input terminal $CI_2$ at the respective pulse generating circuits appears at the set terminal S of RS flip-flop 108 after the lapse of the sum of delay time by the AND gate 106 and that by the output of the output terminal Q of RS flip-flop 108 turning to a low level until the output (the output to the next stage pulse generating circuit 109) of the inverted output terminal $\bar{Q}$ rises to high level.

Therefore, the clocks $\phi_0$ through $\phi_3$ and outputs of $T_0$ through $T_3$ of OR gates 205 through 208 each have a duty defined by the delay time Tc of delay circuit 107, but in case where clock of cycle period 1/n (n:integer) times the external clock is generated, when a delay time until the inverted output $\bar{Q}$ of RS flip-flop 108 appears at the set terminal S of the next stage RS flip-flop 108 is represented by $T_0$, the following inequality must be satisfied:

$$n(Td+T_0)+Tc<Ta.$$

Also, when the frequency is changed to generate, for example, when clock whose frequency is 3 times of the external clock ECLK is generated, the fourth stage clock generator circuit 201d need only be made non-operative. Concretely, the clock genarating circuit 201d does not operate by giving logical "0" at the another input of the AND gate 204 between the clock generating circuits 201c and 201d from the decoder 200, thereby generaing clock whose frequency is three times of the external clock.

In addition, in the aforesaid embodiment the AND gates 202, 203 and 204 are positioned at connecting portions between the 4-phase clock generating circuits 201a to 201d, but may be positioned at connecting portions between the pulse generating circuits 109a through 109d shown in FIG. 4.

In a case of such construction, the phase number of clock can be selected by an external set value.

As seen from the above detailed description, the clock generator of the invention cascade-connects through a plurality of gates polyphase clock generating circuits which cascade-connect single-phase pulse generating circuits of relatively simple constitution using the RS flip-flops and delay circuits, so that the pulse width of output clock is defined by the set delay time of delay circuit at each single-phase pulse generating circuit, thereby not depending on the waveform of external clock. Also, the operating characteristic of RS flip-flop and the delay at each logical circuit interposed between the output of RS flip-flop and the input terminal of the next stage RS flip-flop enable the non overlap between the respective phases to be performed without adding any special circuit. Furthermore, setting of changing frequency of output clock can be easily realized by controling the gates between the respective clock generating circuits.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An n-phase clock generating apparatus that receives an external input signal of a predetermined frequency comprising:
   a plurality of n-phase clock generating circuit stages, n being a predetermined integer, each stage for generating a clock pulse of the first phase in synchronism with the front edge of an external input signal, and n-1 following clock pulses having a fixed phase relationship with said clock pulse of the first phase;
   a plurality of gates serially connecting said clock generating circuit stages such that a previous clock generating circuit stage supplies a next clock generating circuit stage with a signal whose front edge is generated in synchronism with the rear edge of the last following clock pulse of the previous stage when the gate connecting the previous with the next is enabled;
   a plurality of OR gates, each coupled to receive the same phase clock signal from the plurality of stages, each OR gate for outputting a logical sum signal of clock pulses of same phase clock signal received from said clock generating circuit stages; and
   a circuit for outputting a switching signal coupled to said each gate to enable the gates connecting a first m sequential clock generating circuit stages such that the frequency of the generated clock pulses may be a multiple of the frequency of the external input signal.

2. An n-phase clock generating circuit comprising:
   n-number of pulse generating circuits operatively coupled in a serial fashion such that there is a first stage and subsequent stages, each of which is provided with;
   an RS flip-flop having a set input, a reset input, an output and an inverted output;
   a first delay circuit for delaying an external input signal;
   a circuit for generating a front edge of a set pulse for said RS flip-flop by forming the logical product of an inverted signal of the output signal of said first delay circuit and said external input signal of said RS flip-flop;
   a circuit for generating a rear edge of said set pulse in response to an inverted signal of the output of said RS flip-flop; and
   a second delay circuit for delaying said output of said RS flip-flop for a predetermined duration and supplies said delayed output to the reset input of said RS flip-flop, thereby resetting said RS flip-flop;
   so that the output pulse from the front edge of said external input signal to a delay time of said second delay circuit is outputted from the set input of said RS flip-flop;
   and being so constructed that an external clock is inputted as said external input signal to the first stage pulse generating circuit and for said external input signals to said subsequent stages, the inverted output of said RS flip-flop of the previous stage is inputted.

3. An n-phase clock generating apparatus comprising:
   a plurality of clock generating circuits serially coupled having n-number of pulse generating circuits operatively coupled in a serial fashion such that there is a first stage and subsequent stages, each of which is provided with;
   an RS flip-flop having a set input, a reset input, an output, and an inverted output;
   a first delay circuit for delaying an external input signal;
   a circuit for generating a front edge of a set pulse for said RS flip-flop by a logical product of an inverted signal of the output signal of said first delay circuit and said external input signal of said RS flip-flop;
   a circuit for generating a rear edge of said set pulse in response to an inverted signal of the output of said RS flip-flop;
   and a second delay circuit for delaying said output of said RS flip-flop for a predetermined duration and supplies said delayed output to the reset input of said RS flip-flop, thereby resetting said Rs flip-flop;
   so that the output pulse from the front edge of said external input signal to a delay time of said second delay circuit is outputted from the set input of said RS flip-flop;
   and being so constructed that an external clock is inputted as said external input signal to the first stage pulse generating circuit and for said external input signals to said subsequent stages, the inverted output of said RS flip-flop of the previous stage is inputted;
   a plurality of gates being connected between a pair of said clock generating circuits such that a first clock generating circuit of the pair supplies the second clock generating circuit of the pair with a signal whose front edge is generated in synchronism with the rear edge of the last following clock pulse of the previous stage;
   a plurality of OR gates, each coupled to receive the same phase clock signal from the plurality of stages, each OR gate for outputting a logical sum signal of clock pulse of the same phase clock signal received from said clock generating circuit stages; and
   a circuit for outputting a switching signal coupled to said each gate to enable the gates coupling a first m sequential clock generating circuit stages such that the frequency of the generated clock pulses may be an m multiple of the external input signal.

4. A dual phase clock generating circuit comprising:
   a first and a second clock generating stage, each stage having an input terminal, and a first phase output and a second phase output terminal;
   each stage further comprising:
   a first phase and a second phase pulse generating circuit, each pulse generating circuit having a clock input terminal, an output terminal, an inverted output terminal, and means for outputting a pulse and an inverted pulse of a predetermined duration in response to a rising edge of an input signal at the clock input terminal;

the clock input terminal of the second pulse generating circuit of each stage coupled to the inverted output terminal of the first pulse generating circuit of each stage and the clock input terminal of the first pulse generating circuit coupled to the input terminal of the clock generating stage; and the output terminal of the first pulse generating circuit coupled to the first phase output terminal of the clock generating stage and the output terminal of the second pulse generating circuit coupled to the second phase output terminal of the clock generating stage;

with the inverted output terminal of the second pulse generating circuit of the first stage is coupled to the input clock terminal of the first pulse generating circuit of the second stage; and a first and a second OR gate, each having a plurality of input terminals, the inputs of the first OR gate coupled to the first phase output terminals of the first and second stages and the inputs of the second OR gate coupled to the second phase output terminals of the first and second stages.

5. The clock generating circuit of claim 4 wherein each pulse generating circuit further comprises:

an RS flip-flop having a set, a reset, an output, and an inverted output terminal;

a first delay circuit for delaying an external input signal;

a circuit for generating a front edge of a set pulse coupled between the set terminal and an output of the first delay circuit by a logical product of an inverted signal of the first delay circuit and the external input signal;

a circuit for generating a rear edge of the set pulse in response to an inverted signal from the output terminal; and a second delay circuit for delaying a signal from the output terminal for a predetermined duration and supplying the delayed signal from the output terminal to the reset terminal.

* * * * *